US009960756B1

(12) United States Patent
Harwalkar (10) Patent No.: US 9,960,756 B1
(45) Date of Patent: May 1, 2018

(54) BYPASS TECHNIQUES TO PROTECT NOISE SENSITIVE CIRCUITS WITHIN INTEGRATED CIRCUIT CHIPS

(71) Applicant: Silicon Laboratories Inc., Austin, TX (US)

(72) Inventor: Navin Harwalkar, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days. days.

(21) Appl. No.: 15/367,560

(22) Filed: Dec. 2, 2016

(51) Int. Cl.
| H03K 5/1252 | (2006.01) |
| H05K 1/02 | (2006.01) |
| H03F 3/195 | (2006.01) |
| H01L 23/66 | (2006.01) |

(52) U.S. Cl.
CPC ........... *H03K 5/1252* (2013.01); *H05K 1/023* (2013.01); *H05K 1/0216* (2013.01); *H01L 23/66* (2013.01); *H03F 3/195* (2013.01)

(58) Field of Classification Search
CPC ..... H03K 5/1252; H05K 1/0216; H05K 1/023
USPC .................................................. 327/379, 551
See application file for complete search history.

(56) References Cited

U.S. PATENT DOCUMENTS

| 6,445,564 | B1 | 9/2002 | Naitoh |
| 6,509,799 | B1 | 1/2003 | Franca-Neto |
| 6,522,195 | B2 | 2/2003 | Watanabe et al. |
| 6,927,646 | B2 | 8/2005 | Niemi |
| 7,518,881 | B2 | 4/2009 | Cornelius |
| 9,098,101 | B2 | 8/2015 | Naidu et al. |
| 2016/0157336 | A1* | 6/2016 | Murai .................. H05K 1/0234 361/782 |

OTHER PUBLICATIONS

Yao et al., "1.5-2.7 GHz Ultra Low Noise Bypass LNA" 3 pgs. (Jun. 2014).

* cited by examiner

*Primary Examiner* — William Hernandez
(74) *Attorney, Agent, or Firm* — Egan Peterman Enders Huston (57) ABSTRACT

Bypass techniques are provided herein to protect noise sensitive circuits from both internal and external noise sources. According to one embodiment, an integrated circuit (IC) chip may include a noise sensitive circuit coupled between a power supply pad and a first ground pad of the IC chip. In order to protect the first ground pad of the noise sensitive circuit, two distinct bypass paths are provided to route noise current around the noise sensitive circuit. Each bypass path terminates in its own ground pad (e.g., a second ground pad and third ground pad), which is separate from the first ground pad of the noise sensitive circuit.

29 Claims, 5 Drawing Sheets

BYPASS TECHNIQUES TO PROTECT NOISE SENSITIVE CIRCUITS WITHIN INTEGRATED CIRCUIT CHIPS

BACKGROUND

1. Field of the Disclosure

This disclosure relates to electronic systems and circuits and, more particularly, to techniques to protect noise sensitive circuits from both internal and external noise sources.

2. Description of the Relevant Art

The following descriptions and examples are provided as background only and are intended to reveal information that is believed to be of possible relevance to the disclosed embodiments. No admission is necessarily intended, or should be construed, that any of the following information constitutes prior art impacting the patentable character of the subjected matter claimed herein.

Electronic noise (or simply "noise") is a common design problem in many different types of systems and circuits. In electronic systems and circuits, noise is a random fluctuation in an electrical signal, and is a characteristic of all electronic circuits. In communication systems and circuits, noise is an error or undesired random disturbance of a useful information signal (such as a radio frequency signal or other wireless or wireline signal). Many different types of noise exist including thermal noise, shot noise, flicker noise (or 1/f noise), burst noise, transit-time noise, and coupled or induced noise caused, for example, by electromagnetic interference (EMI). The power spectral density of noise can be tonal, white or shaped.

Noise can adversely affect a system or circuit in a variety of different ways including, but not limited to, noisy and distorted analog measurements, error-prone digital communications, latch-up problems with port pads, and other undesirable behavior. To avoid noise related problems, a system designer must remove the interfering noise source, or find ways to protect the system or circuit being adversely affected by noise. The system designer may employ a variety of different techniques for reducing noise, or mitigating the effects noise may have on a system or circuit, depending on the type of noise generated, the location of the noise source, and the system or circuit being affected.

Figure 1:
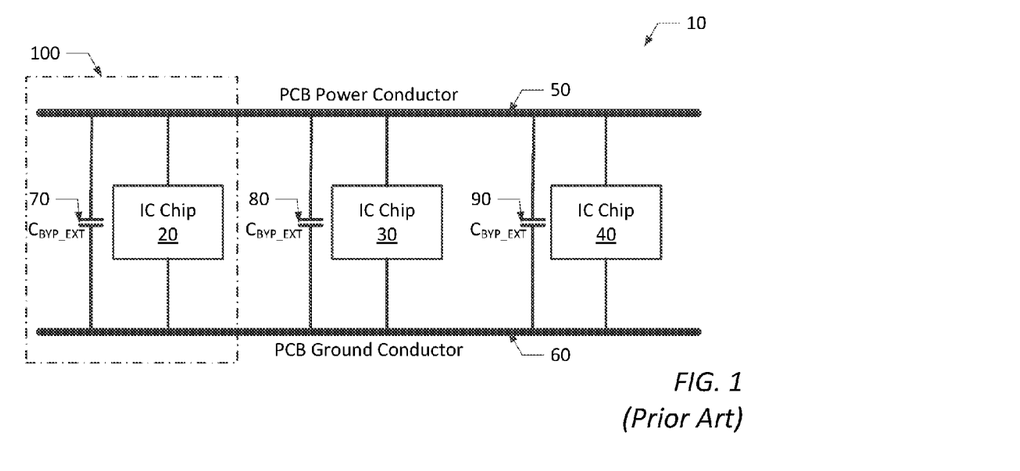
FIG. 1 (Prior Art) is a block diagram illustrating an exemplary electronic system including a plurality of integrated circuit (IC) chips mounted onto a printed circuit board (PCB), wherein each IC chip is provided with an external bypass capacitor for protecting the IC chip from some external noise sources.

FIG. 1 (Prior Art) is a block diagram illustrating a portion of an exemplary electronic system 10 including a plurality of integrated circuit (IC) chips 20, 30 and 40, which may be mounted onto a printed circuit board (PCB, not shown) by any known method. In the exemplary system shown in FIG. 1, the IC chips are coupled between a PCB power conductor 50 (e.g., a power supply plane or trace carrying a supply voltage to the IC chips) and a PCB ground conductor 60 (e.g., a ground supply plane or trace carrying the return path to ground). The electronic system shown in FIG. 1 is provided to illustrate a conventional method for protecting an IC chip from some types of external noise sources.

In some cases, noise may enter electronic system 10 through the power supply distribution system. Power supply noise may enter system 10 through the power supply leads, may be generated by the system power supply, or may be inductively coupled onto the power supply conductor when supply lines pass through a noisy environment. Power supply noise is carried on PCB power conductor 50 and conducted to all IC chips 20, 30 and 40, and is one example of an external noise source (e.g., a noise source located outside of the IC chip) that may enter the IC chips via a conductive path. Another example of an external noise source may be electromagnetic interference (EMI). EMI produced by one or more of the IC chips (e.g., IC chip 30), or an off-system source, may induce noise within a nearby IC chip (e.g., IC chip 20/40) or within the power and/or ground conductors through coupling of electromagnetic waves onto nearby conductors.

Power supply and ground noise coupling can also occur within circuits that share common impedances, such as when two or more circuits (e.g., IC chips 20, 30 and 40) share the same power supply conductor (e.g., PCB power conductor 50) and ground conductor (e.g., PCB ground conductor 60). If one circuit (e.g., IC chip 20) creates a sudden demand in current, the other circuit's (e.g., IC chips 30/40) supply voltage will drop, due to the common impedance the circuits share between the supply lines and the source impedance. The same effect occurs in the return-to-ground conductor. Return currents that flow in one circuit may create ground bounce in the other circuit's return path, resulting in a noisy ground potential. A noisy ground will affect any circuit referenced to ground, and may severely degrade the performance of analog circuits, such as wireless and wireline receivers, operational amplifiers, analog-to-digital converters, and sensor processing/conditioning analog front ends.

One conventional approach for protecting a circuit from external noise sources, such as the noise sources mentioned above, is to couple an external bypass capacitor ($C_{BYP\_EXT}$) 70, 80, 90 between the PCB power conductor 50 and the PCB ground conductor 60 for each IC chip 20, 30 and 40 requiring protection. When coupled as shown in FIG. 1, bypass capacitors 70, 80 and 90 are used to decouple one part of an electrical circuit from another, and thus, may also be referred to as decoupling capacitors. Power supply noise, ground noise and noise from nearby circuits is shunted through the bypass capacitors, reducing the effect the noise has on the protected circuits. To improve effectiveness, each bypass capacitor may include one or more capacitors arranged as close as possible to the protected circuit. Although external bypass capacitors ($C_{BYP\_EXT}$) may be effective for protecting the IC chips 20, 30, 40 from some types of external noise sources, they cannot protect noise sensitive circuits within the IC chips from internal noise sources (i.e., noise sources located inside of an IC chip).

Figure 2:
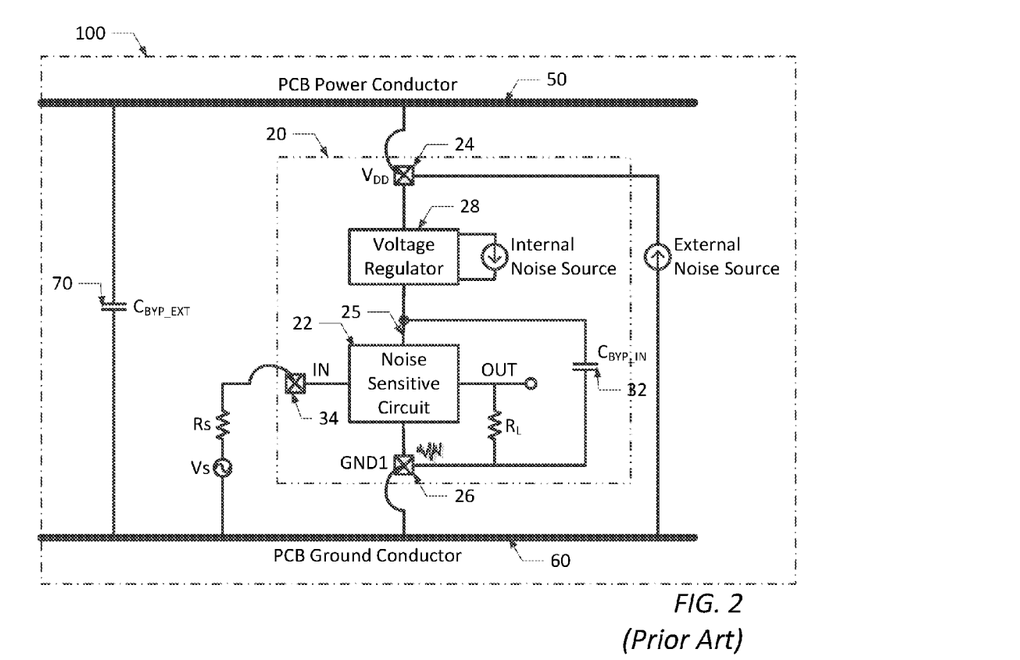
FIG. 2 (Prior Art) is a block diagram illustrating IC chip 20 and external bypass capacitor 70 of the electronic system shown in FIG. 1, further illustrating a conventional bypass technique commonly used to protect noise sensitive circuits residing within the IC chip from internal and/or external noise sources.

FIG. 2 (Prior Art) is a block diagram illustrating a portion 100 of electronic system 10 including bypass capacitor 70 and IC chip 20. FIG. 2 is provided herein to show common noise sources (labeled "Internal Noise Source" and "External Noise Source") that may adversely affect a noise sensitive circuit 22 included within IC chip 20, as well as a conventional method commonly used for protecting the noise sensitive circuit 22 from such noise sources.

As shown in FIG. 2 (Prior Art), IC chip 20 includes a power supply pad ($V_{DD}$) 24 and ground pad (GND1) 26, which are respectively connected to PCB power conductor 50 and PCB ground conductor 60 through some finite impedance (such as a bond wire). In some cases, a voltage regulator 28 may be included within the IC chip and coupled between the $V_{DD}$ pad 24 and the power supply input of noise sensitive circuit 22 for regulating the supply voltage provided to circuit 22. In the illustrated circuit, voltage regulator 28 is one example of an internal noise source that may adversely affect noise sensitive circuit 22 by transferring the thermal noise generated across the voltage regulator to the supply 25 and ground 26 inputs of the sensitive circuit.

IC designers almost always couple a large on-chip capacitor ($C_{BYP\_IN}$) 32 between the output of voltage regulator 28 and GND1 pad 26 of the noise sensitive circuit 22 to provide a bypass path for shunting noise current to ground. However, this arrangement has a number of shortcomings and fails to effectively protect the noise sensitive circuit no matter how large the on-chip capacitor 32 is made. For example, noise current from the internal noise source flows through the impedance connecting GND1 pad 26 to PCB ground conductor 60 and creates voltage noise on GND1 pad 26, as shown in FIG. 2. Since the input (IN) pad 34 of the noise sensitive circuit 22 is referenced directly to the PCB ground potential, any voltage noise on the GND1 pad 26 is interpreted as an input by the noise sensitive circuit 22. A portion of the noise current from an external noise source may also appear on GND1 pad 26 by the same mechanism, and may be seen as an input by the noise sensitive circuit 22. Depending on the type of noise sensitive circuit, the voltage noise at GND1 pad 26 may be amplified at the output (OUT) of the noise sensitive circuit, or may produce other undesirable results.

Although providing an on-chip bypass capacitor 32 for bypassing the supply input of a circuit to the circuit's own GND1 pad 26 may provide adequate protection for circuits with sufficient noise immunity (e.g., fully differential RF front-ends), it cannot be used to adequately protect noise sensitive circuits (e.g., single-ended RF or analog front-ends) from both internal and external noise sources.

SUMMARY

The following description of various embodiments of electronic systems and circuits is not to be construed in any way as limiting the subject matter of the appended claims.

Improved bypass techniques are provided herein to protect noise sensitive circuits from both internal and external noise sources. According to one embodiment, a noise sensitive circuit may be coupled between a power supply pad and a first ground pad of an integrated circuit (IC) chip. In order to protect the ground pad of the noise sensitive circuit from noise current generated from internal and/or external noise sources, two distinct bypass paths are provided within the IC chip for routing noise current around the noise sensitive circuit to ground. Each bypass path terminates in its own ground pad (e.g., a second ground pad and third ground pad), which is separate from the ground pad (e.g., the first ground pad) of the noise sensitive circuit.

As set forth in more detail below, the two bypass paths each present a low impedance to the noise current, while a high impedance circuit is coupled between the bypass paths and further coupled in series with the supply input of the noise sensitive circuit to present a high impedance to the noise current. With this configuration, the bypass techniques disclosed herein push noise out to the second and third ground pads, and prevent noise from appearing at the ground pad of the noise sensitive circuit. Since noise on the ground pad of the noise sensitive circuit looks like an input to the noise sensitive circuit, while noise on the second and third ground pads does not, the bypass techniques disclosed herein protect the noise sensitive circuit from noise sources by preventing noise from appearing at the input of the noise sensitive circuit.

According to one embodiment, an IC chip provided herein may generally include a circuit (otherwise referred to herein as a "noise sensitive circuit") coupled between a power supply pad and a first ground pad of the IC chip, a first bypass path coupled between the power supply pad and a second ground pad of the IC chip, and a second bypass path coupled between the power supply pad and a third ground pad of the IC chip. The second and third ground pads are separate from the first ground pad.

The first bypass path and the second bypass path are each configured to provide a path for noise current to flow around the circuit (sometimes referred to herein as a "noise sensitive circuit") to ground. In some embodiments, the IC chip may include an additional circuit coupled to the circuit. The additional circuit may be a source of the noise current, which is generated within the IC chip and routed around the circuit via the first and second bypass paths. In order to route noise current around the circuit, the first and second bypass paths may each be implemented with a low impedance circuit, which is configured to present a low impedance to the noise current. A high impedance circuit may also be included within the IC chip, and may be configured to present a high impedance to the noise current. In one embodiment, the high impedance circuit may be coupled between the first and second bypass paths, and may be coupled in series between the power supply pad and a power supply input of the circuit.

In one example, the high impedance provided by the high impedance circuit may be about 10 times to about 100 times larger than the low impedance provided by the low impedance circuits. In one embodiment, the second and third ground pads of the IC chip may be configured to be coupled to a ground conductor on a printed circuit board by separate bond wires. In such an embodiment, the low impedance provided by the low impedance circuits may be at least 10 times less than an impedance of the bond wires.

In one embodiment, the low impedance circuit of the first bypass path may include a first capacitor coupled between a first node of the high impedance circuit and the second ground pad, and the low impedance circuit of the second bypass path may include a second capacitor coupled between a second node of the high impedance circuit and the third ground pad. In such an embodiment, the high impedance circuit may be coupled between the first and second capacitors, and may include a resistor or an inductor.

In another embodiment, the low impedance circuit of the first bypass path may include a first inductor coupled in series with a first capacitor to form a first LC resonant circuit, and the low impedance circuit of the second bypass path may include a second inductor coupled in series with a second capacitor to form a second LC resonant circuit. In such an embodiment, the high impedance circuit may be coupled between the first and second LC resonant circuits, and may include a third inductor coupled in parallel with a third capacitor to form a third LC resonant circuit.

According to another embodiment, an electronic system provided herein may generally include a printed circuit board having at least one power conductor and at least one ground conductor, and at least one integrated circuit (IC) chip mounted onto the printed circuit board. In general, the at least one IC chip may include a power supply pad coupled to the at least one power conductor, a first ground pad, a second ground pad and a third ground pad, each separately coupled to the at least one ground conductor, and a circuit (otherwise referred to herein as a "noise sensitive circuit") coupled between the power supply pad and the first ground pad. In order to protect the circuit from noise current, the IC chip may further include a first bypass path coupled between the power supply pad and the second ground pad, and a second bypass path coupled between the power supply pad and the third ground pad. As stated above, the first and second bypass paths may each provide a path for noise current to flow around the circuit to the second and third ground pads, thereby protecting the first ground pad of the circuit.

In some embodiments, the IC chip may include an additional circuit coupled to the circuit. The additional circuit may be a source of the noise current, which is generated within the IC chip and routed around the circuit via the first and second bypass paths. In such embodiments, the first bypass path may be coupled between an output of the additional circuit and the second ground pad, and the second bypass path may be coupled between the power supply input of the circuit and the third ground pad.

As noted above, the first and second bypass paths may each comprise a low impedance circuit, which is configured to present a low impedance to the noise current. The low impedance circuits may be configured as described above. In addition to the low impedance circuits included within the first and second bypass paths, the IC chip may further include a high impedance circuit, which may be coupled between the first and second bypass paths, coupled in series between the output of the additional circuit and the power supply input of the circuit, and configured to present a high impedance to the noise current. The high impedance circuit may be configured as described above.

Although not strictly limited to such, the IC chip described herein may be, or may include, a radio frequency (RF) or analog front end, and the circuit (the "noise sensitive circuit") may be a single-ended amplifier, in one embodiment. In one exemplary embodiment, the circuit may be a single-ended Low Noise Amplifier (LNA), and the additional circuit responsible for generating at least a portion of the noise current may be a voltage regulator, which is coupled between the power supply pad and a power supply input of the single-ended LNA.

According to another embodiment, a method is provided herein to bypass noise in an integrated circuit (IC) chip. The IC chip may generally include a circuit (e.g., a noise sensitive circuit) coupled between a power supply pad and a first ground pad of the IC chip, a first bypass path coupled between the power supply pad and a second ground pad of the IC chip, and a second bypass path coupled between the power supply pad and a third ground pad of the IC chip. The method may generally include operating the IC chip, receiving noise current associated with operation of the IC chip, and bypassing the noise current around the circuit using a first bypass path and a second bypass path. In some embodiments, the method may further include operating an additional circuit coupled to the circuit within the IC chip, the additional circuit being a source of the noise current. In order to bypass the noise current around the circuit, the first and second bypass paths may each include a low impedance circuit, which is configured to present a low impedance to the noise current. In addition to the low impedance circuits included within the first and second bypass paths, the IC chip may further include a high impedance circuit, which is coupled between the first and second bypass paths and configured to present a high impedance to the noise current.

BRIEF DESCRIPTION OF THE DRAWINGS

Other objects and advantages of the inventions will become apparent upon reading the following detailed description and upon reference to the accompanying drawings.

While the present disclosure is susceptible to various modifications and alternative forms, specific embodiments thereof are shown by way of example in the drawings and will herein be described in detail. It should be understood, however, that the drawings and detailed description thereto are not intended to limit the present disclosure to the particular form disclosed, but on the contrary, the intention is to cover all modifications, equivalents and alternatives falling within the spirit and scope of the present disclosure as defined by the appended claims.

DETAILED DESCRIPTION OF THE PREFERRED EMBODIMENTS

FIGS. 3-7 illustrate exemplary embodiments of improved bypass techniques that may be included within an integrated circuit to protect noise sensitive circuits from both internal and external noise sources. As used herein, an "internal noise source" is one which originates from within an electronic circuit (e.g., an integrated circuit chip) comprising the noise sensitive circuit. Likewise, an "external noise source" is one that originates from outside of the electronic circuit. Non-limiting examples of internal noise sources include thermal noise of a linear regulator supplying the noise sensitive circuit, and clock spurs due to switching regulators and/or switched bias circuits. Non-limiting examples of external noise sources include thermal noise and escape currents (due to clock and/or data activity) from other on-chip circuits connected to the power supply pad. Although power supply and ground noise are discussed herein as examples of external noise sources, and thermal noise generated across a voltage regulator is provided as an example of an internal noise source, it is understood that the improved bypass circuit embodiments described herein could be used to protect a noise sensitive circuit from many other types of internal and external noise sources. As such, the noise sources discussed herein are provided merely for illustrative purposes.

A circuit whose performance is significantly affected and/or degraded by noise generated by other on-chip circuits and/or external sources may be referred to herein as a "noise sensitive circuit." A noise sensitive circuit may encompass many different types of circuits, which may be used to receive, condition, and/or amplify relatively small signals, including but not limited to, signals in the microvolts to millivolts range. Non-limiting examples of noise sensitive circuits include low-level analog circuits (including but not limited to amplifiers, analog-to-digital converters, and sensors), wireless receivers (including but not limited to GSM, CDMA, LTE, Bluetooth, GPS, Wi-Fi, HD/FM radio, and satellite receivers) and wireline receivers (including but not limited to cable TV receivers, cable modems and disk drive read circuits).

Figure 4:
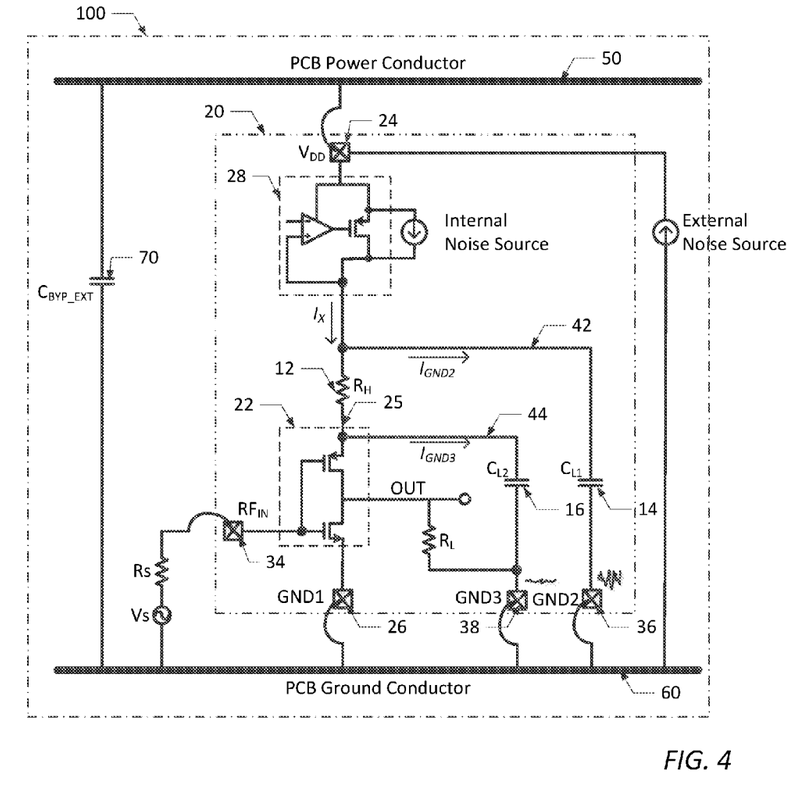
FIG. 4 illustrates a first embodiment for improved bypass circuitry that may be used to protect a particular noise sensitive circuit (e.g., a single-ended, common source, CMOS Low Noise Amplifier, LNA) residing with IC chip 20 from internal and/or external noise sources.

According to one exemplary embodiment, a noise sensitive circuit may be a single-ended, common-source, CMOS Low-Noise Amplifier (LNA), which is configured for operation in the GHz frequency range (e.g., about 1-10 GHz), as shown in FIG. 4 and discussed in more detail below. In such an embodiment, the electronic circuit (or IC chip) containing the LNA may be a low-noise radio frequency (RF) amplifier front-end. However, the embodiments disclosed herein are not strictly limited to any particular noise sensitive circuit, or any particular operating frequency range. Furthermore, the embodiments disclosed herein may be implemented within other types of electronic circuits (or IC chips), non-limiting examples of which include wireless receivers, wireline receivers, and sensor and analog front ends.

Figure 3:
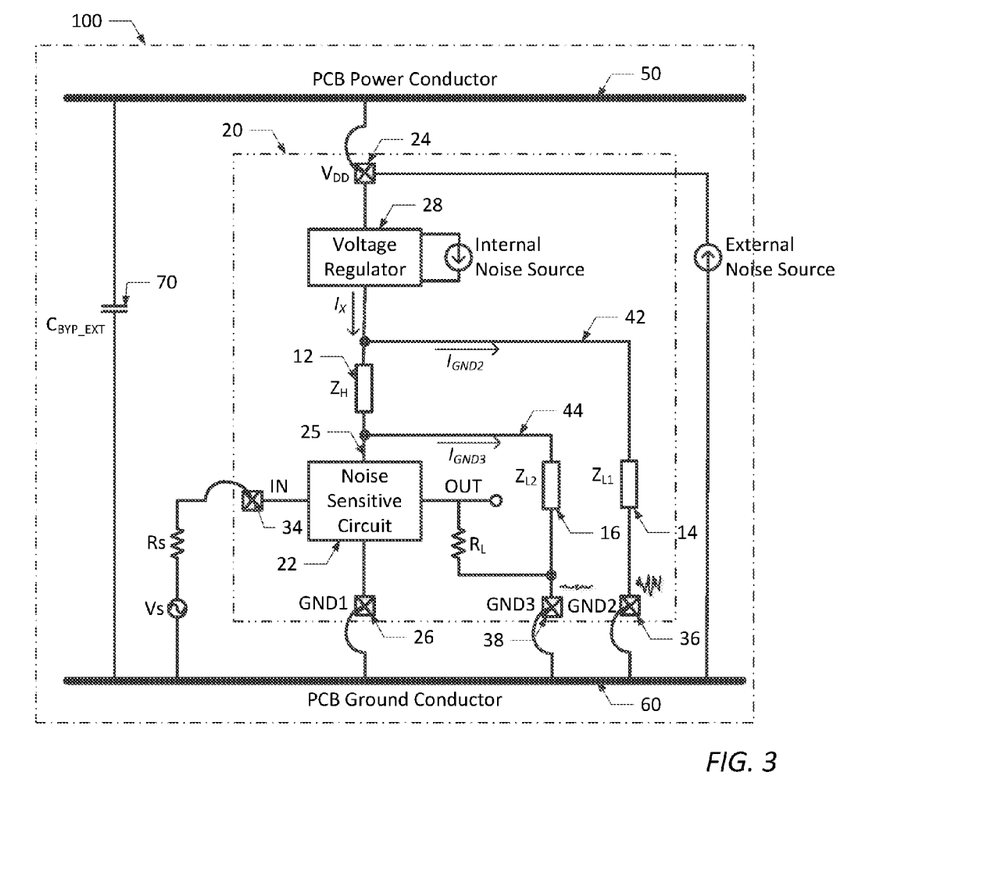
FIG. 3 illustrates a general embodiment of an improved bypass technique disclosed herein to protect noise sensitive circuits residing within IC chip 20 from internal and/or external noise sources.

FIG. 3 is a block diagram illustrating a portion 100 of an exemplary electronic system 10, similar to that shown in FIGS. 1-2 (Prior Art). In the exemplary system shown in FIG. 3, IC chip 20 and external bypass capacitor ($C_{BYP\_EXT}$) 70 are coupled between a PCB power conductor 50 and PCB ground conductor 60. The power and ground conductors 50, 60 may include individual traces or planes, which are printed on and/or sandwiched between layers of a printed circuit board (PCB, not shown). As shown in FIG. 3, IC chip 20 may include a noise sensitive circuit 22, which is generally coupled between a power supply pad ($V_{DD}$) 24 and a first ground pad (GND1) 26 of IC chip 20. The $V_{DD}$ pad 24 and GND1 pad 26 are respectively connected to PCB power and ground conductors 50 and 60 through some finite impedance (such as a bond wire).

In some embodiments, an on-chip voltage regulator 28 may be coupled between $V_{DD}$ pad 24 and the power supply input of noise sensitive circuit 22 for regulating the supply voltage provided to circuit 22. In the illustrated embodiment, voltage regulator 28 represents an example of an internal noise source that may adversely affect noise sensitive circuit 22 by forwarding the thermal noise generated across the voltage regulator to the supply and ground inputs of the sensitive circuit. Although thermal noise across voltage regulator 28 is discussed herein, the disclosed bypass circuitry can also be used to protect noise sensitive circuit 22 from other types of noise (e.g., clock spurs) and/or from other types of internal noise sources (e.g., switching regulators and/or switched bias circuits). As such, voltage regulator 28 is included within IC chip 20 merely as an example of an internal noise source, and may not be included within IC chip 20 in all embodiments.

As noted above, the most common approach for protecting a noise sensitive circuit from internal noise sources is to couple a relative large on-chip capacitor (e.g., $C_{BYP\_IN}$ 32, FIG. 2) between the output of the noise source (e.g., voltage regulator 28) and the GND1 pad 26 of the noise sensitive circuit to provide a bypass path for shunting noise current to ground. Unfortunately, this arrangement allows noise current to flow through the finite impedance connecting the GND1 pad 26 of the noise sensitive circuit 22 to the PCB ground conductor 60, thereby, creating voltage noise on the GND1 pad 26, as shown in FIG. 2. Since the input (IN) pad 34 of the noise sensitive circuit 22 is referenced directly to the PCB ground potential, any voltage noise on the GND1 pad 26 is interpreted as an input by the noise sensitive circuit. A portion of the noise current from external noise source(s) may also appear on the GND1 pad 26 by the same mechanism, and may also be seen as an input by the noise sensitive circuit. Depending on the type of noise sensitive circuit, voltage noise at the GND1 pad 26 may be amplified at the output (OUT) of the noise sensitive circuit, or may produce other undesirable results. Unfortunately, coupling a large on-chip bypass capacitor 32 as shown in FIG. 2 for bypassing the supply input of a circuit to the circuit's own GND1 pad 26 cannot be used to adequately protect noise sensitive circuits (e.g., single-ended amplifiers and receivers) from both internal and external noise sources.

FIG. 3 illustrates an embodiment of an improved bypass technique that addresses problems associated with the conventional bypass circuits shown in FIGS. 1-2 by providing two distinct bypass paths 42, 44 for noise current to flow around noise sensitive circuit 22. Each bypass path terminates in its own ground pad 36, 38 (labeled GND2 and GND3), which is separate and distinct from the ground (GND1) pad 26 of the noise sensitive circuit 22. In some embodiments, the improved bypass circuitry may be implemented by adding two new ground pads 36 and 38 to the IC chip 20. GND1 pad 26 (i.e., a first ground pad), GND2 pad 36 (i.e., a second ground pad) and GND3 pad 38 (i.e., a third ground pad) are separately connected to PCB ground conductor 60 by some finite impedance (such as a bond wire). It is noted that the first, second and third ground pads may be connected to PCB ground conductor 60 in a variety of different ways (e.g., including direct bonding to a ground paddle within the package for the IC chip 20, bonded to one or more pins within the package for the IC chip 20, and/or other bonding techniques).

The IC chip 20 shown in FIG. 3 includes a first bypass path 42 coupled between the output of voltage regulator 28 and the second (GND2) pad 36 for routing noise current around noise sensitive circuit 22 to the second ground pad, and a second bypass path 44 coupled between the supply input 25 of the noise sensitive circuit 22 and the third (GND3) pad 38 for routing noise current around the noise sensitive circuit 22 to the third ground pad. The noise current routed around noise sensitive circuit 22 by the first and second bypass paths 42, 44 may be generated by one or more internal noise sources residing within IC chip 20, and/or by one or more external noise sources residing outside of IC chip 20, yet coupled to the IC chip via a radiative and/or a conductive path. Examples of potential internal and external noise sources are discussed above. In the illustrated embodiment, voltage regulator 28 represents an example of an internal noise source that generates at least a portion of the noise currents. Since voltage regulator 28 is provided merely as an exemplary internal noise source, and not actually part of the bypass circuit embodiments disclosed herein, the voltage regulator may not be included in all embodiments of the IC chip. In such embodiments, bypass path 42 may be coupled to the output of another internal noise source, or may be coupled for receiving an unregulated supply voltage from the power supply pad 24.

In the general embodiment shown in FIG. 3, a low impedance circuit 14, 16 ($Z_{L1}$ and $Z_{L2}$) is included within each bypass path 42, 44. A high impedance circuit 12 ($Z_H$) is coupled between bypass paths 42 and 44, and coupled in series between the output of voltage regulator 28 and the power supply input 25 of the noise sensitive circuit 22. In general, the low impedance circuits 14, 16 ($Z_{L1}$ and $Z_{L2}$) are configured to present a low impedance, and the high impedance circuit 12 ($Z_H$) is configured to present a high impedance, to the noise current ($I_{noise}$) generated by the internal and external noise sources. Since the impedance of $Z_{L1}$, $Z_{L2}$, and $Z_H$ is frequency dependent, $Z_{L1}$ and $Z_{L2}$ should be configured to present a low impedance, and $Z_H$ should be configured to present a high impedance, at a frequency (or frequency range) of interest to the circuit designer. The noise frequencies of "interest" are generally dependent on the circuit being affected by noise (e.g., noise sensitive circuit 22). In circuits where noise is additive, the noise frequencies of interest may be similar to the frequency of the input (IN) signal received by the noise sensitive circuit 22. In circuits where noise is multiplicative, the noise frequency of interest may be different from the input signal frequency. One skilled in the art would understand how to determine the noise frequencies of interest for a particular circuit design, and how to configure a low impedance circuit and a high impedance circuit for the noise frequencies of interest.

Although example impedances are discussed below for an exemplary GHz frequency range, the bypass circuit embodiments described herein is not limited to any particular frequency or frequency range. As such, the impedances of the $Z_{L1}$, $Z_{L2}$, and $Z_H$ circuits may be more accurately described as a ratio or multiple of one another. In one example, the high impedance provided by the high impedance circuit 12 ($Z_H$) may be about 10 times to about 100 times larger than the low impedance provided by the low impedance circuits 14, 16 ($Z_{L1}$ and $Z_{L2}$). In some cases, the impedance of the low impedance circuits ($Z_{L1}$ and $Z_{L2}$) may also be dependent on the finite impedance connecting IC chip 20 to ground. In one example, the low impedance provided by the low impedance circuits ($Z_{L1}$ and $Z_{L2}$) may be at least 10 times less than the impedance (e.g., +j1 to +j100 ohms at commonly used RF frequencies) of the respective bond wires connecting the GND2 and GND3 pads to PCB ground conductor 60.

With the improved bypass circuitry shown in FIG. 3, noise current ($I_X$) generated by both internal and external noise sources is split between GND2 pad 36 and GND3 pad 38 according to the equations below:

$$I_{GND2} = I_X \frac{Z_H + Z_{L2}}{Z_H + Z_{L2} + Z_{L1}} \quad \text{EQ. 1}$$

$$I_{GND3} = I_X \frac{Z_{L1}}{Z_H + Z_{L2} + Z_{L1}} \quad \text{EQ. 2}$$

As evidenced by EQ. 1 and EQ. 2, a majority of the noise current ($I_{GND2}$) will flow through the first bypass path 42 (and $Z_{L1}$) to GND2 pad 36, while a smaller fraction of the noise current ($I_{GND3}$) flows through the second bypass path 44 (and $Z_{L2}$) to GND3 pad 38. This prevents voltage noise from appearing at the GND1 pad 26 of the noise sensitive circuit 22, and instead, pushes it out to the GND2 pad 36 and to the GND3 pad 38 (albeit to a smaller extent). It is noted that noise on the GND1 pad 26 of the noise sensitive circuit 22 looks like an input to the noise sensitive circuit, whereas noise on GND2 pad 36 and GND3 pad 38 does not. In this manner, the improved bypass circuitry prevents noise from appearing at the GND1 pad 26 of the noise sensitive circuit.

Although illustrated as generic impedances in FIG. 3, it will be understood that the low impedance circuits 14, 16 ($Z_{L1}$ and $Z_{L2}$) and the high impedance circuit 12 ($Z_H$) may be implemented in a variety of different ways. FIGS. 4-7 illustrate various embodiments of the bypass techniques described herein. A first embodiment of the bypass circuitry shown generically in FIG. 3 is illustrated in FIG. 4. In the first embodiment, the low impedance circuit 14 within bypass path 42 includes a first capacitor ($C_{L1}$) coupled between a first node of the high impedance circuit 12 and GND2 pad 36, the low impedance circuit 16 within bypass path 44 includes a second capacitor ($C_{L2}$) coupled between a second node of the high impedance circuit 12 and GND3 pad 38, and the high impedance circuit 12 includes a resistor ($R_H$), which is coupled between the first and second capacitors. In one example, the resistor ($R_H$) included within high impedance circuit 12 may be selected to provide a relatively high impedance of about 10Ω to about 1000Ω.

Figure 5:
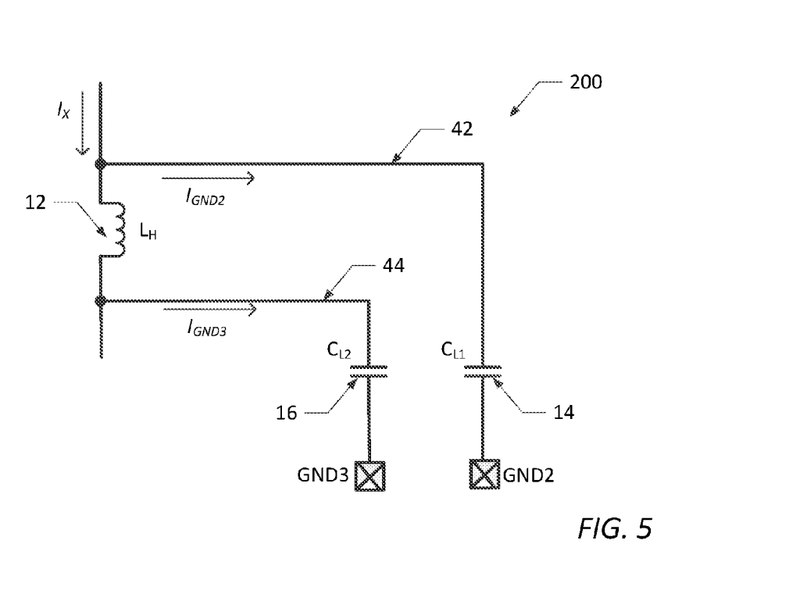
FIG. 5 illustrates a second embodiment for improved bypass circuitry that may be used to protect a noise sensitive circuit residing with IC chip 20 from internal and/or external noise sources.

A second embodiment 200 of the bypass techniques described herein is illustrated in FIG. 5. In the second embodiment, the high impedance circuit 12 may be implemented with an inductor ($L_H$), instead of a resistor ($R_H$), when the noise sensitive circuit 22 is configured for operating at higher operating frequencies. In one example, an inductor with an inductance of about 1 nH to about 100 nH may be used in the second embodiment to provide a relatively high impedance at higher operating frequencies (including, but not limited to, GHz frequencies). In the second embodiment, an inductor may be preferred over a resistor, since inductors typically require less voltage headroom than resistors to achieve the same amount of filtering at higher operating frequencies. However, since inductors consume more area than resistors, the second embodiment may only be preferred when voltage headroom is a concern and operating frequencies are high (e.g., GHz frequencies).

In the first and second embodiments illustrated in FIGS. 4 and 5, the capacitance of the first and second capacitors ($C_{L1}$ and $C_{L2}$) for the low impedance circuits 14, 16 may be selected to present a relatively low impedance to the noise current at the noise frequency (or frequencies) of interest. As noted above, the noise frequency (or frequency range) of interest is generally dependent on the circuit being affected by the noise current. In some embodiments, the noise frequency (or frequency range) may be similar to the operating frequency (or frequency range) of the noise sensitive circuit 22, while in other embodiments, the noise frequency range may be different.

In the first and second embodiments, the capacitance of the first and second capacitors ($C_{L1}$ and $C_{L2}$) is selected to present a relatively low impedance to the noise current at the operating frequency range of the noise sensitive circuit 22. As known in the art, capacitive reactance (i.e., the imaginary part of impedance) is inversely proportional to both capacitance and frequency, according to the equation below.

$$X_c = \frac{1}{2\pi f C} \quad \text{EQ. 3}$$

In EQ. 3, $X_c$ is the capacitive reactance, C is the capacitance and f is the frequency of operation of the noise sensitive circuit. When noise sensitive circuit 22 is configured for operation in a GHz frequency range (e.g., about 2.4 GHz to about 2.6 GHz), the first and second capacitors ($C_{L1}$ and $C_{L2}$) may be implemented with 1 pF to 1 nF capacitors to present a relatively low impedance of about 1-10Ω to the noise current. Selecting the capacitance based on the operating frequency of the noise sensitive circuit enables noise current frequencies similar to the operating frequency of the noise sensitive circuit to be routed around the noise sensitive circuit via the first and second bypass paths 42, 44.

Figure 6:
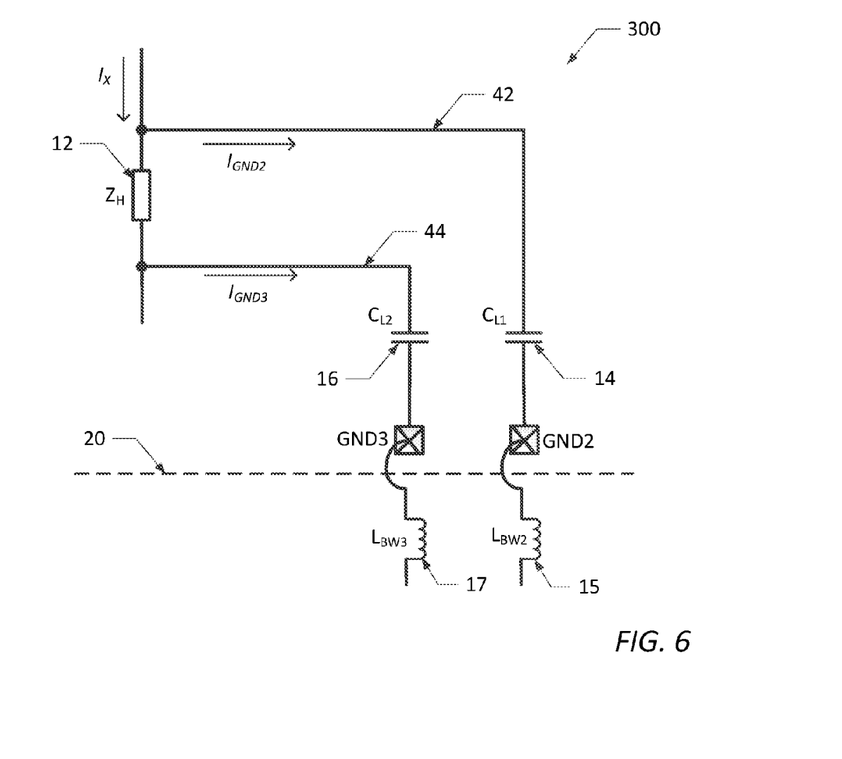
FIG. 6 illustrates a third embodiment for improved bypass circuitry that may be used to protect a noise sensitive circuit residing with IC chip 20 from internal and/or external noise sources.
Figure 7:
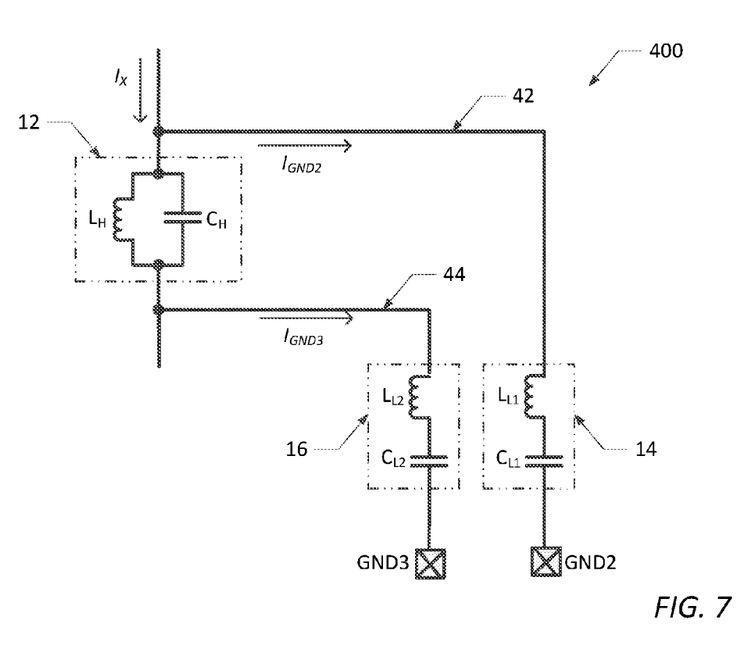
FIG. 7 illustrates a fourth embodiment for improved bypass circuitry that may be used to protect a noise sensitive circuit residing with IC chip 20 from internal and/or external noise sources.

A third embodiment 300 of the bypass techniques described herein is illustrated in FIG. 6. In the third embodiment, the low impedance circuits 14, 16 within bypass paths 42, 44 are implemented with capacitors ($C_{L1}$ and $C_{L2}$), while the high impedance circuit 12 is implemented with a resistor or an inductor (depicted generically as $Z_H$). Unlike the first and second embodiments, the capacitance of the first and second capacitors ($C_{L1}$ and $C_{L2}$) is selected in the third embodiment to present a relatively low impedance to the noise current at a frequency range, which differs from the operating frequency range of the noise sensitive circuit 22.

For example, the capacitance of the first and second capacitors ($C_{L1}$ and $C_{L2}$) may be chosen, in the third embodiment, to resonate with the inductance ($L_{BW2}$ and $L_{BW3}$) of the bond wires 15, 17 connecting GND2 pad 36 and GND3 pad 38 to the PCB ground conductor 60. In this embodiment, the series LC resonance provided by each capacitor ($C_{L1}$ and $C_{L2}$) and ground bond wire inductance ($L_{BW2}$ and $L_{BW3}$) creates a very low impedance, which depends on the package and bond wire geometry. More specifically, the inductive reactance is proportional to the inductance of the bond wires and the resonant frequency of the LC resonant circuit, according to the equation below.

$$X_L = 2\pi f L \qquad \text{EQ. 4}$$

In EQ. 4, $X_L$ is the inductive reactance, L is the inductance of the ground bond wires and f is frequency. As known in the art, resonance occurs in a series LC resonant circuit when:

$$X_L = -X_c \qquad \text{EQ. 5}$$

Since the inductance ($L_{BW2}$ and $L_{BW3}$) of the bond wires is known and dependent on the geometry of the bond wires used to connect the GND2 and GND3 pads to the PCB ground conductor, the capacitance of the first and second capacitors ($C_{L1}$ and $C_{L2}$) may be chosen in the third embodiment, according to EQS. 3-5 above, and the frequency f can be set to the operating frequency of the noise sensitive circuit or any other desired frequency of interest. In one example, the first and second capacitors may be implemented with 0.1 pF to 100 pF capacitors when the ground bond wire inductances range between about 0.1 nH to about 10 nH to present a relatively low impedance of about 0.1Ω to about 10Ω to the noise current.

A fourth embodiment 400 of the bypass techniques described herein is illustrated in FIG. 6. In the fourth embodiment, the low impedance circuits 14, 16 may be implemented with series LC resonant circuits ($L_{L1}C_{L1}$ and $L_{L2}C_{L2}$), and the high impedance circuit 2 may be implemented with a parallel LC resonant circuit ($L_H//C_H$). Specifically, the low impedance circuit 14 within bypass path 42 may include a first inductor ($L_{L1}$) coupled in series with the first capacitor ($C_{L1}$) to form a first LC resonant circuit, which is coupled in series with GND2 pad 36. The low impedance circuit 16 within bypass path 44 may include a second inductor ($L_{L2}$) coupled in series with the second capacitor ($C_{L2}$) to form a second LC resonant circuit, which is coupled in series with GND3 pad 38. The high impedance circuit 12 may include a third inductor ($L_H$) coupled in parallel with a third capacitor ($C_H$) to form a third LC resonant circuit, which is coupled between bypass paths 42 and 44.

In the fourth embodiment, the first, second and third LC resonant circuits may each be tuned to the operating frequency of the noise sensitive circuit 22, which enables noise current frequencies similar to the operating frequency of the noise sensitive circuit to be routed around the noise sensitive circuit via the bypass paths 42, 44. In one example, the first and second capacitors ($C_{L1}$ and $C_{L2}$) may be implemented with 50 fF to 5 pF capacitors, and the first and second inductors ($L_{L1}$ and $L_{L2}$) may be implemented with 100 nH to 1 nH inductors, to present a relatively low impedance of about 1Ω to about 100Ω to the noise current when noise sensitive circuit 22 is configured for operating in a GHz frequency range (e.g., about 2.4 GHz to about 2.6 GHz). In such an example, the third capacitor ($C_H$) may be implemented with a 50 fF to 5 pF capacitor, and the third inductor ($L_H$) may be implemented with a 100 nH to 1 nH inductor, to present a relatively high impedance of about 10Ω to about 1000Ω to the noise current in the same frequency range.

Although the fourth embodiment has the potential for providing bypass paths 42 and 44 with near zero impedances, it does so over a narrow frequency range. In addition, inductors used in the first, second and third LC resonant circuits increase the area consumed by the $Z_{L1}$, $Z_{L2}$ and $Z_H$ circuits. For this reason, the embodiment as illustrated in FIG. 4 may be preferred, in at least one embodiment, so as to reduce costs, free up board space, avoid the use of on-chip inductors and improve the frequency response.

In the embodiment shown in FIG. 4, noise sensitive circuit 22 is a single-ended, common-source, CMOS Low Noise Amplifier (LNA) operating in a GHz frequency range. In this particular embodiment, source terminals of the NMOS and PMOS transistors need to be protected against noise sources, such as but not limited to the exemplary internal and external noise sources shown in FIG. 4 and discussed above. In order to do so, a first bypass path 42 having a relatively low impedance is coupled between the output of voltage regulator 28 and GND2 pad 36, and a second bypass path 44 having a relative low impedance is coupled between the power supply input of LNA 22 and GND3 pad 38. In addition, a high impedance circuit 12 is coupled between the first and second bypass paths 42, 44, and further coupled in series between the output of voltage regulator 28 and the power supply input of LNA 22.

In the illustrated embodiment, on-chip capacitors ($C_{L1}$ and $C_{L2}$) are used within the first and second bypass paths 42, 44 to implement the low impedance circuits 14, 16, and a resistor ($R_H$) is used to implement the high impedance circuit 12, which is coupled between bypass paths 42 and 44. In one example, the on-chip capacitors ($C_{L1}$ and $C_{L2}$) may be implemented with 1 pF to 1 nF capacitors to provide a relatively low impedance of about 100Ω to about 0.1Ω to the noise current, and resistor ($R_H$) may be configured to provide a relatively high impedance of about 10Ω to about 1000Ω to the noise current, when LNA 22 is configured for operation at about 2.4 GHz. Other values of capacitance and resistance may be used at other operating frequencies.

As shown in FIG. 4, the source terminal of the NMOS input device of the LNA is connected to GND1 pad 26, while the source terminal of the PMOS device is bypassed to GND3 pad 38 through capacitor $C_{L2}$. The output of the voltage regulator 28 is bypassed to GND2 pad 36 through capacitor $C_{L1}$. With this arrangement, the noise current generated by internal and external noise sources is divided among the first and second bypass paths 42 and 44 according to EQS. 1 and 2 above. Thus, noise current is largely diverted to GND2 pad 36 by the combined action of $R_H$ and $C_{L1}$. A much smaller fraction of the noise current bypasses LNA 22 to GND3 pad 38. Ripple on the power supply pad, $V_{DD}$ 24, is rejected by the same mechanism and is diverted to GND2 pad 36 and GND3 pad 38 (albeit to a much smaller extent), thereby protecting the sensitive GND1 pad 26 of LNA 22 from the noise current.

In principle, no noise current should flow into the sensitive GND1 pad 26 of LNA 22 when the bypass techniques described herein is utilized. Without the disclosed bypass techniques, noise currents would be allowed to flow into the GND1 pad 26 of the LNA 22 (either directly through LNA 22, or through the $C_{BYP\_IN}$ capacitor shown in FIG. 2), which would result in a significant degradation in the Noise Figure (NF) of the single-ended LNA (since thermal noise on GND1 pad 26 looks like an input and gets amplified by the LNA). The magnitude of this noise relative to the LNA's intrinsic thermal noise is proportional to the square of the transconductance ($G_m$) of the LNA. For this reason, high current LNAs suffer acutely from this problem, unless the bypass techniques as disclosed herein are used.

It will be appreciated to those skilled in the art having the benefit of this disclosure that this disclosure is believed to provide improved bypass circuitry that may be included within an electronic circuit (e.g., an IC chip) to protect on-chip noise sensitive circuits from both internal and external noise sources. Further modifications and alternative embodiments of various aspects of the disclosure will be apparent to those skilled in the art in view of this description. It is to be understood that the various embodiments of the disclosed bypass techniques shown and described herein are to be taken as the presently preferred embodiments. It will be further understood that although particular values of capacitance, inductance, resistance and impedance are discussed herein, these values are provided for explanatory purposes only, and to provide an exemplary range of values for the relative terminology (e.g., low/high impedance) used herein. One skilled in the art would understand how alternative values of capacitance, inductance and/or resistance may be used to implement the improved bypass circuit embodiments shown in FIGS. 3-7 and described herein, and how such values may differ for different noise frequencies.

Elements and materials may be substituted for those illustrated and described herein, parts and processes may be reversed, and certain features of the disclosed embodiments may be utilized independently, all as would be apparent to one skilled in the art after having the benefit of this disclosure. It is intended, therefore, that the following claims be interpreted to embrace all such modifications and changes and, accordingly, the specification and drawings are to be regarded in an illustrative rather than a restrictive sense.

What is claimed is:

1. An integrated circuit (IC) chip, comprising:
    a circuit coupled between a power supply pad and a first ground pad of the IC chip;
    a first bypass path coupled between the power supply pad and a second ground pad of the IC chip, the first bypass path providing a path for noise current around the circuit; and
    a second bypass path coupled between the power supply pad and a third ground pad of the IC chip, the second bypass path providing a path for noise current around the circuit;
    wherein the second and third ground pads are separate from the first ground pad.

2. The integrated circuit chip as recited in claim 1, wherein the IC chip further comprises an additional circuit coupled to the circuit, the additional circuit being a source of the noise current, which is generated within the IC chip and routed around the circuit via the first and second bypass paths.

3. The integrated circuit chip as recited in claim 1, wherein the first and second bypass paths each comprise a low impedance circuit, which is configured to present a low impedance to the noise current.

4. The integrated circuit chip as recited in claim 3, wherein the second and third ground pads of the IC chip are configured to be coupled to a ground conductor on a printed circuit board by separate bond wires, and wherein the low impedance provided by the low impedance circuits is at least 10 times less than an impedance of the bond wires.

5. The integrated circuit chip as recited in claim 3, further comprising a high impedance circuit, which is coupled between the first and second bypass paths and coupled in series between the power supply pad and a power supply input of the circuit, wherein the high impedance circuit is configured to present a high impedance to the noise current.

6. The integrated circuit chip as recited in claim 5, wherein the high impedance provided by the high impedance circuit is about 10 times to about 100 times larger than the low impedance provided by the low impedance circuits.

7. The integrated circuit chip as recited in claim 5, wherein the low impedance circuit of the first bypass path comprises a first capacitor coupled between a first node of the high impedance circuit and the second ground pad, and wherein the low impedance circuit of the second bypass path comprises a second capacitor coupled between a second node of the high impedance circuit and the third ground pad.

8. The integrated circuit chip as recited in claim 7, wherein the high impedance circuit is coupled between the first and second capacitors, and comprises a resistor or an inductor.

9. The integrated circuit chip as recited in claim 7, wherein the low impedance circuit of the first bypass path further comprises a first inductor coupled in series with the first capacitor to form a first LC resonant circuit, and wherein the low impedance circuit of the second bypass path further comprises a second inductor coupled in series with the second capacitor to form a second LC resonant circuit.

10. The integrated circuit chip as recited in claim 9, wherein the high impedance circuit is coupled between the first and second LC resonant circuits, and wherein the high impedance circuit comprises a third inductor coupled in parallel with a third capacitor to form a third LC resonant circuit.

11. An electronic system, comprising:
    a printed circuit board having at least one power conductor and at least one ground conductor;
    at least one integrated circuit (IC) chip mounted onto the printed circuit board, wherein the at least one IC chip comprises:
        a power supply pad coupled to the at least one power conductor;
        a first ground pad, a second ground pad and a third ground pad, each separately coupled to the at least one ground conductor;
        a circuit coupled between the power supply pad and the first ground pad;
        a first bypass path coupled between the power supply pad and the second ground pad, the first bypass path providing a path for noise current around the circuit to the second ground pad; and a second bypass path coupled between the power supply pad and the third ground pad, the second bypass path providing a path for noise current around the circuit to the third ground pad.

12. The electronic system as recited in claim 11, wherein the IC chip further comprises an additional circuit coupled to the circuit, the additional circuit being a source of noise current within the IC chip.

13. The electronic system as recited in claim 12, wherein the additional circuit comprises a voltage regulator coupled between the power supply pad and a power supply input of the circuit, and wherein the voltage regulator generates at least a portion of the noise current.

14. The electronic system as recited in claim 12, wherein the first bypass path is coupled between an output of the additional circuit and the second ground pad, and wherein the second bypass path is coupled between the power supply input of the circuit and the third ground pad.

15. The electronic system as recited in claim 14, wherein the first and second bypass paths each comprise a low impedance circuit, which is configured to present a low impedance to the noise current.

16. The electronic system as recited in claim 15, wherein the IC chip further comprises a high impedance circuit, which is coupled between the first and second bypass paths, coupled in series between the output of the additional circuit and the power supply input of the circuit, and configured to present a high impedance to the noise current.

17. The electronic system as recited in claim 16, wherein the high impedance provided by the high impedance circuit is about 10 times to about 100 times larger than the low impedance provided by the low impedance circuits.

18. The electronic system as recited in claim 16, wherein the second and third ground pads are coupled to the at least one ground conductor of the printed circuit board by separate bond wires, and wherein the low impedance provided by the low impedance circuits is at least 10 times less than an impedance of the bond wires.

19. The electronic system as recited in claim 16, wherein the low impedance circuit of the first bypass path comprises a first capacitor coupled between a first node of the high impedance circuit and the second ground pad, and wherein the low impedance circuit of the second bypass path comprises a second capacitor coupled between a second node of the high impedance circuit and the third ground pad, and wherein the high impedance circuit is coupled between the first and second capacitors, and comprises a resistor or an inductor.

20. The electronic system as recited in claim 19, wherein the low impedance circuit of the first bypass path further comprises a first inductor coupled in series with the first capacitor to form a first LC resonant circuit, and wherein the low impedance circuit of the second bypass path further comprises a second inductor coupled in series with the second capacitor to form a second LC resonant circuit.

21. The electronic system as recited in claim 20, wherein the high impedance circuit is coupled between the first and second LC resonant circuits, and wherein the high impedance circuit comprises a third inductor coupled in parallel with a third capacitor to form a third LC resonant circuit.

22. The electronic system as recited in claim 11, wherein the IC chip comprises a radio frequency (RF) or analog front end, and wherein the circuit comprises a single-ended amplifier.

23. The electronic system as recited in claim 22, wherein the circuit comprises a single-ended Low Noise Amplifier (LNA).

24. A method to bypass noise in an integrated circuit (IC) chip, comprising:

operating an integrated circuit (IC) chip, the IC chip including a circuit coupled between a power supply pad and a first ground pad of the IC chip, a first bypass path coupled between the power supply pad and a second ground pad of the IC chip, and a second bypass path coupled between the power supply pad and a third ground pad of the IC chip;

receiving noise current associated with operation of the IC chip; and bypassing the noise current around the circuit using the first bypass path and the second bypass path.

25. The method as recited in claim 24, further comprising operating an additional circuit coupled to the circuit within the IC chip, the additional circuit being a source of the noise current.

26. The method as recited in claim 24, wherein the first and second bypass paths each comprise a low impedance circuit, which is configured to present a low impedance to the noise current.

27. The method as recited in claim 26, wherein the second and third ground pads of the IC chip are configured to be coupled to a ground conductor on a printed circuit board by separate bond wires, and wherein the low impedance provided by the low impedance circuits is at least 10 times less than an impedance of the bond wires.

28. The method as recited in claim 26, wherein the IC chip further comprises a high impedance circuit coupled between the first and second bypass paths and coupled in series between the power supply pad and a power supply input of the circuit, wherein the high impedance circuit is configured to present a high impedance to the noise current.

29. The method as recited in claim 28, wherein the high impedance provided by the high impedance circuit is about 10 times to about 100 times larger than the low impedance provided by the low impedance circuits.

* * * * *